(12) United States Patent  
Bois et al.

(10) Patent No.: US 11,683,092 B2
(45) Date of Patent: Jun. 20, 2023

(54) LOSS-BASED WAVELENGTH METER

(71) Applicant: Ciena Corporation, Hanover, MD (US)

(72) Inventors: Antoine Bois, Québec (CA); Alexandre Delisle-Simard, Québec (CA); Marie-Josée Picard, L'Ancienne-Lorette (CA); Michel Poulin, Québec (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/183,538

(22) Filed: Feb. 24, 2021

(65) Prior Publication Data

US 2021/0266066 A1 Aug. 26, 2021

Related U.S. Application Data

(60) Provisional application No. 62/980,492, filed on Feb. 24, 2020.

(51) Int. Cl.
*H04B 10/07* (2013.01)
*H04B 10/079* (2013.01)
(Continued)

(52) U.S. Cl.
CPC ... *H04B 10/07955* (2013.01); *G02B 6/12004* (2013.01); *G02B 2006/1215* (2013.01);
(Continued)

(58) Field of Classification Search
CPC ........ H04B 10/07955; H04B 10/07957; H04B 10/07; H04B 10/674; H04B 10/675; G02B 6/12004; G02B 2006/12138; G02B 2006/1215; G02B 2006/12154; G02B 6/1223; G02B 6/12007; G02B 6/126; G02B 2006/12061; G02B 2006/12123; G02B 2006/12126; G02B 6/125; H01S 5/0683
(Continued)

(56) References Cited

U.S. PATENT DOCUMENTS 5,195,151 A * 3/1993 Campbell, Jr ....... G02B 6/2821
  65/409
5,398,296 A * 3/1995 Lin ...................... G02B 6/14
  385/140

(Continued)

FOREIGN PATENT DOCUMENTS

CA 2428288 A1 11/2003

OTHER PUBLICATIONS

Kasap, Optoelectronics and Photonics Principles and Practices, Jan. 2012, Pearson Education, All Document. (Year: 2012).*
(Continued)

*Primary Examiner* — Dibson J Sanchez
(74) *Attorney, Agent, or Firm* — Baratta Law PLLC; Lawrence A. Baratta, Jr.

(57) ABSTRACT

A loss-based wavelength meter includes a first photodiode configured to measure power of monochromatic light; and a loss section having a monotonic wavelength dependency, wherein a wavelength of the monochromatic light is determined based on measurements of the first photodiode after the monochromatic light has gone through the loss section. This provides a compact implementation that may be used in integrated optics devices using silicon photonics as well as other embodiments.

20 Claims, 8 Drawing Sheets

(51) Int. Cl.
  *G02B 6/12* (2006.01)
  *H01S 5/0683* (2006.01)
  *H04B 10/67* (2013.01)

(52) U.S. Cl.
  CPC .............. *G02B 2006/12138* (2013.01); *G02B 2006/12154* (2013.01); *H01S 5/0683* (2013.01); *H04B 10/07* (2013.01); *H04B 10/07957* (2013.01); *H04B 10/674* (2013.01); *H04B 10/675* (2013.01)

(58) Field of Classification Search
  USPC ........................................ 398/9–38, 202–214
  See application file for complete search history.

(56) References Cited

U.S. PATENT DOCUMENTS

| | | | | |
|---|---|---|---|---|
| 5,729,347 | A * | 3/1998 | So | G01J 3/26 356/419 |
| 5,798,859 | A * | 8/1998 | Colbourne | H01S 3/13 359/638 |
| 5,966,493 | A * | 10/1999 | Wagoner | G02B 6/266 385/140 |
| 5,999,271 | A * | 12/1999 | Shih | G01S 7/483 250/214 R |
| 6,097,874 | A * | 8/2000 | Yunoki | G02B 6/266 385/140 |
| 6,134,253 | A * | 10/2000 | Munks | H01S 3/13 372/9 |
| 6,144,025 | A * | 11/2000 | Tei | G01J 9/00 250/206 |
| 6,310,703 | B1 * | 10/2001 | Alavie | H04B 10/07955 398/9 |
| 6,621,952 | B1 * | 9/2003 | Pi | G02B 6/29355 385/39 |
| 6,912,343 | B1 * | 6/2005 | Chen | G02B 6/30 385/30 |
| 7,352,931 | B1 | 4/2008 | Painchaud et al. | |
| 8,095,615 | B2 | 1/2012 | Briscoe et al. | |
| 8,406,621 | B2 | 3/2013 | Painchaud et al. | |
| 8,619,824 | B2 | 12/2013 | Ayotte et al. | |
| 8,767,778 | B2 | 7/2014 | Briscoe et al. | |
| 8,948,549 | B2 | 2/2015 | Picard et al. | |
| 9,063,354 | B1 * | 6/2015 | Rakich | G02B 6/3576 |
| 9,239,431 | B1 * | 1/2016 | Rakich | G02B 6/12007 |
| 9,383,272 | B2 * | 7/2016 | Buck | G01L 25/00 |
| 9,703,047 | B2 | 7/2017 | Painchaud et al. | |
| 9,823,419 | B1 | 11/2017 | Pelletier et al. | |
| 9,851,521 | B2 | 12/2017 | Pelletier et al. | |
| 9,941,973 | B2 | 4/2018 | Simard et al. | |
| 10,025,035 | B2 | 7/2018 | Painchaud et al. | |
| 10,197,821 | B2 | 2/2019 | Poulin et al. | |
| 10,663,663 | B2 | 5/2020 | Painchaud et al. | |
| 10,823,988 | B2 | 11/2020 | Latrasse et al. | |
| 10,830,638 | B2 | 11/2020 | Pelletier et al. | |
| 10,908,474 | B2 | 2/2021 | Vitic et al. | |
| 11,333,556 | B2 * | 5/2022 | Arsenault | G01D 5/35354 |
| 2002/0044286 | A1 * | 4/2002 | Le-Gall | H01S 5/0687 356/519 |
| 2002/0093657 | A1 * | 7/2002 | Friberg | G01J 9/00 356/419 |
| 2003/0103708 | A1 * | 6/2003 | Galstian | G02F 1/0118 385/39 |
| 2004/0008413 | A1 | 1/2004 | Trepanier et al. | |
| 2004/0208437 | A1 * | 10/2004 | Pacheco | G02B 6/421 385/48 |
| 2005/0089296 | A1 * | 4/2005 | Furusawa | G02B 6/266 385/140 |
| 2005/0219536 | A1 * | 10/2005 | Feldman | G01J 9/00 356/419 |
| 2006/0062518 | A1 * | 3/2006 | Galstian | B82Y 10/00 385/27 |
| 2011/0038036 | A1 * | 2/2011 | Todt | H01S 5/0265 359/341.1 |
| 2016/0070062 | A1 * | 3/2016 | Lipson | G02B 6/122 385/30 |
| 2017/0343411 | A1 * | 11/2017 | McNulty | G01J 9/00 |
| 2018/0231713 | A1 | 8/2018 | Picard | |
| 2020/0064707 | A1 | 2/2020 | Vitic et al. | |
| 2020/0073154 | A1 | 3/2020 | Simard et al. | |
| 2020/0124883 | A1 | 4/2020 | Delisle-Simard et al. | |
| 2020/0363665 | A1 | 11/2020 | Latrasse et al. | |
| 2021/0018768 | A1 | 1/2021 | O'Keefe et al. | |

OTHER PUBLICATIONS

Ackerman et al, Low Cost Athermal Wavelength Locker Integrated, Jan. 2004, JOLT, All Document. (Year: 2004).*

Stephens, Dielectric Waveguides and Optical Fibers, Jul. 2017, All Document. https://slideplayer.com/slide/10598546/ (Year: 2017).*

Dell'Olio et al, Novel CMOS Compatible Athermal and Polarization Insensitive Ring Resonator, Dec. 2018, IEEE, All Document. (Year: 2018).*

Dinleyici et al, Calculation of the Wavelength Filter Properties of the Fiber-Slab Waveguide Structure, Nov. 1998, JOLWT, All Document. (Year: 1998).*

G. Rajan et al., "An all-fiber temperature sensor based on a macro-bend singlemode fiber loop", Electronic Letters, Jan. 1, 2008, vol. 44, No. 19, pp. 1123-1124, School of Electronic and Communications Engineering.

M. Dobosz et al., "Overview of the laser-wavelength measurement methods", Warsaw University of Technology, Article in Optics and Lasers in Engineering, Nov. 2017, pp. 1-43.

Q. Wang et al., "Low-cost wavelength measurement based on a macrobending single-mode fiber", Jun. 15, 2006, vol. 31, No. 12, Optics Letters, pp. 1785-1787.

* cited by examiner

S1 PROVIDING MONOCHROMATIC LIGHT THROUGH A LOSS SECTION HAVING A MONOTONIC WAVELENGTH DEPENDENCY

S2 DETECTING POWER OF THE MONOCHROMATIC LIGHT AFTER THE LOSS SECTION

S3 DETERMINING A WAVELENGTH OF MONOCHROMATIC LIGHT BASED ON MEASUREMENTS AFTER THE MONOCHROMATIC LIGHT HAS GONE THROUGH THE LOSS SECTION

LOSS-BASED WAVELENGTH METER

CROSS-REFERENCE TO RELATED APPLICATION(S)

The present non-provisional patent application claims priority to U.S. Provisional Patent Application Ser. No. 62/980,492, filed Feb. 24, 2020, and entitled "LOSS-BASED WAVELENGTH METER," which is incorporated in full by reference herein.

FIELD OF THE DISCLOSURE

The present disclosure generally relates to optical components. More particularly, the present disclosure relates to systems and methods for a loss-based wavelength meter.

BACKGROUND OF THE DISCLOSURE

A wavelength meter is used for precise wavelength measurements on laser beams. There are various conventional approaches for implementing a wavelength meter. A gas cell standard is often used for absolute wavelength referencing. The gas cell contains absorptions peaks at known wavelengths. If the wavelength is tuned to these peaks, it becomes possible to calibrate the rate of tuning and the wavelength at every point thereof. Another approach includes absolutely referencing an optical frequency comb (e.g., a mode-locked laser) by frequency doubling, providing absolute comb lines to which one can measure, e.g., a beat note to obtain the wavelength. A diffraction grating can be used, as is conventionally done in Optical Spectrum Analyzers (OSA). With some assumptions (length of optical paths, rate of tuning of the paths, expected wavelength range, etc.), the wavelength can also be determined with interferometric techniques (e.g., a tunable Fabry-Perot cavity). Fabry-Perot etalons of different characteristics can also be combined to provide a reading that is not limited to a single free spectral range.

Disadvantageously, these conventional approaches are not compact nor easily adaptable within an integrated optics platform (Silicon photonics). Also, in the case of an absolute standard (e.g., gas cell), the feedback cannot be provided in real-time, as the laser must be tuned to one or multiple specific wavelengths to check for drifts. It is not known from such conventional approaches how a large spectral range can be accommodated. For interferometric methods, one clear disadvantage is sensitivity to environmental perturbations capable of perturbing the optical phase.

Embodiments of the present disclosure address the foregoing needs and others.

BRIEF SUMMARY OF THE DISCLOSURE

The present disclosure relates to systems and methods for a loss-based wavelength meter. The present disclosure uses the propagation of an optical signal in a section in which the wavelength dependence of the losses has been made monotonic. By measuring the transmission through such a section, as a ratio between input and output optical powers, the wavelength is resolved, as this ratio is then unique. By using techniques to obtain a high degree of wavelength dependence for the losses, this approach provides a compact wavelength meter that can be useful, for example, to set the wavelength of a tunable laser, or to measure the wavelength of any monochromatic light input. Depending on the specific implementation, the required tapped fraction of the monochromatic light can be very small. In a tunable laser application, such a wavelength determination method is required to properly select the lasing wavelength for a given communication channel. This wavelength is ultimately selected by a tunable optical filter, to which the wavelength meter output can serve as feedback. Of course, the wavelength meter can operate in any application, and any application described herein is for illustration purposes.

The present disclosure further relates to making an athermal integrated wavelength meter through the monotonic wavelength-dependent transmission of an on-chip optical component. By measuring this transmission through a ratio of the optical power before and after the wavelength-dependent component, an unambiguous wavelength reading is provided.

Accordingly, disclosed are novel specific implementations within an integrated photonic platform and including, e.g., a novel method (evanescent coupling) that achieves athermality and monotonicity. For example, according to embodiments, the method advantageously introduces evanescent coupling into a section that is absorbing to the optical light or where light is alternatively scattered if no material absorption exists. This evanescent coupling is not thermally sensitive and provides a monotonic wavelength dependency over a certain wavelength range.

According to embodiments, a compact wavelength meter is provided that can be advantageously integrated within a tunable laser assembly and used to help set its wavelength. The compact form factor of the wavelength meter can also be integrated in Silicon photonic devices. In embodiments, the size of the wavelength meter can be in the millimeter or even micrometer range. For example, a reasonable implementation would extend from a 100 µm to a bit more than 1 mm the total length, but be very slim in width (<50 µm). Such dimensions make the proposed wavelength meter well suited to be advantageously used in small form factor devices including pluggable optical modules (e.g., CFP, QSFP-DD, OSFP, and variants thereof).

In an embodiment, a loss-based wavelength meter includes a first photodiode configured to measure power of monochromatic light; and a loss section having a monotonic wavelength dependency, wherein a wavelength of the monochromatic light is determined based on measurements of the first photodiode after the monochromatic light has traversed the loss section. The loss-based wavelength meter can further include a second photodiode at a different location from the first photodiode, and the wavelength is determined based on a ratio of the measurements of the first photodiode and the second photodiode. The loss-based wavelength meter can further include a polarizing shaping section. The second photodiode can be located before the loss section for an input power measurement. The loss-based wavelength meter can further include a third photodiode between the first photodiode and the second photodiode.

The loss section can include absorbing metal for a wavelength range of interest. The loss section can include a doped semiconductor. The loss section can include a semiconductor with a bandgap lower than photon energy in a wavelength range of interest. The loss section can include Ge. The loss section can include bend waveguides to assist modal overlap with an adjacent section. The loss section can utilize coupling into radiative modes through waveguide roughness or waveguide bends. The loss section can utilize light coupling to a substrate. The loss-based wavelength meter can be an athermal integrated wavelength meter. The loss-based wavelength meter can further include a plurality of taps for temperature insensitivity based on tap ratios of the plurality of taps. The loss section can be located in an arm of an interferometer and a phase shifting element is located in another arm.

In another embodiment, a method of utilizing a loss-based wavelength meter includes providing monochromatic light through a loss section having a monotonic wavelength dependency; detecting power of the monochromatic light after the loss section; and determining a wavelength of monochromatic light based on measurements after the monochromatic light has gone through the loss section. The determining can be based on a ratio of the measurements from a plurality of photodetectors. The determining can be based on the measurements after the monochromatic light traverse two different arms of an interferometer. The method can further include utilizing a plurality of taps for temperature insensitivity based on tap ratios of the plurality of taps. The method can further include combining the measurements with a measurement from a highly accurate but periodic optical reference.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
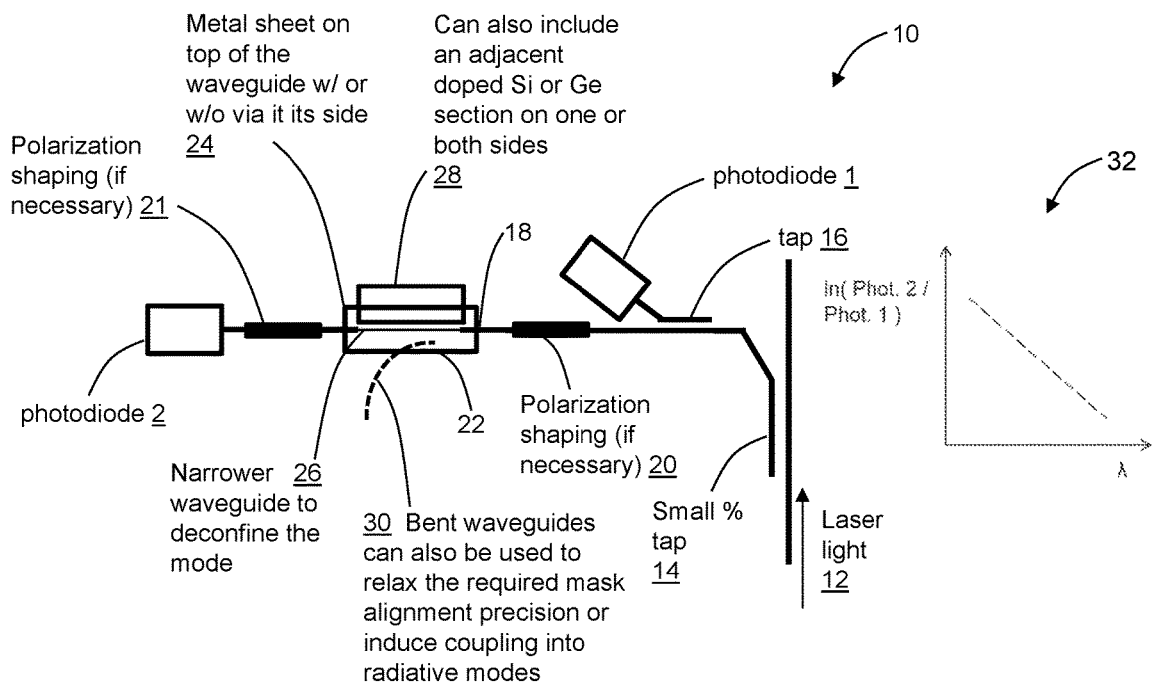
FIG. 1 is a diagram of an example implementation of a loss-based wavelength meter.

In various embodiments, the present disclosure relates to systems and methods for a loss-based wavelength meter. The present disclosure uses the propagation of an optical signal in a section in which the wavelength dependence of the losses has been made monotonic. By measuring the transmission through such a section, as a ratio between input and output, the wavelength is resolved, as this ratio is then unique. By using techniques to obtain a high degree of wavelength dependence for the losses, this approach provides a compact wavelength meter to an integrated tunable laser, as an example, or any other compact implementation requiring a measurement of the wavelength of a monochromatic light signal. Depending on the specific implementation, in an integrated laser assembly, the required tap ratio of the main laser light is very small. In an integrated laser assembly as used for an optical communication application, a wavelength determination mechanism is used to properly select the lasing wavelength for a given communication channel. This wavelength is ultimately selected by a tunable optical filter, to which this wavelength meter can serve as feedback. This approach is also temperature insensitive compared to at least some of the other wavelength meter approaches. Moreover, the loss-based wavelength meter presented herein is very compact and can be easily integrated within standard integrated photonic platforms, especially those of high index contrast and with access to metal, Ge photodiodes, or doping levels.

In an embodiment, a loss-based wavelength meter includes at least two photodiodes configured to measure power of laser light, at two different locations, and a loss section in-between the at least two photodiodes, wherein a wavelength of the laser light is determined based on measurements of the at least two photodiode currents.

Consider a section of length L with an optical attenuation coefficient $\alpha(\lambda)$ with explicit dependence on the wavelength $\lambda$. $\alpha(\lambda_2) > \alpha(\lambda_1)$ for any $\lambda_2 > \lambda_1$, i.e., $\alpha$ is monotonic as a function of $\lambda$. For a given operating wavelength range $\Delta\lambda = (\lambda_2 - \lambda_1)$, a certain loss ratio $\xi$ might be required for a sufficient accuracy. This is expressed mathematically as $\exp(-\alpha(\lambda_1) L)/\exp(-\alpha(\lambda_2) L) = \xi$. From this expression, the required L is found to be $-\ln(\xi)/(\alpha(\lambda_1) - \alpha(\lambda_2))$. The total insertion losses from this L becomes $\exp(-\alpha(\lambda)[-\ln(\lambda)/\Delta\alpha])$. For a viable design (small L, low insertion losses that maximize SNR, sufficiently large $\xi$), a large $\Delta\alpha = (\alpha(\lambda_1) - \alpha(\lambda_2))$ is therefore required.

A monotonic $\alpha(\lambda)$ is best realized with non-interferometric techniques. Interferometry depends on the phase of the light, which is most affected by the surrounding environment, for example the temperature. A high refractive index contrast platform such as silicon-on-insulator allows a large wavelength dependence on the mode field size if the waveguide itself is made very narrow. This optical mode has an exponential evanescent tail that grows proportionally to the wavelength and interacts with its environment outside the waveguide. This exponential overlap tends to induce an exponential (linear in logarithmic scale) wavelength dependence on the losses, regardless of the loss mechanism.

These potential mechanisms can include:
1. absorption through metal, a doped semiconductor (such as Si), or any semiconductor with a bandgap lower than the photon energy of a wavelength range of interest (e.g., Ge for the C-band (about 1530 nm-1565 nm) or O-band (about 1260 nm-1360 nm), or any range in the infrared band.
2. substrate light coupling, depending on the thickness of the buried oxide layer,
3. coupling into radiative modes through waveguide roughness or waveguide bends, the latter also enabling a relaxation of the required mask alignment precision by increasing the optical mode overlap with a side section.

The absorption through metal can be by absorbing metal surrounding the optical waveguide (above, on the side(s) or both); the optical mode can be expanded using smaller waveguide (for example) for larger overlap with metal sections and increased loss dependency to wavelength.

The slope $\Delta\alpha$ is directly related to the sensitivity. For a given ration in losses ($\xi$) between the upper and lower $\lambda$, a larger slope ($\Delta\alpha$) produces a smaller device and a smaller global insertion loss:

$$\exp(-\alpha_1 L)/\exp(-\alpha_2 L) = \xi => L = -\ln(\xi)/(\alpha_1-\alpha_2)$$

$$\exp(-\alpha_1 L) \leq > \exp(-\alpha_1[-\ln(\xi)/(\alpha_1-\alpha_2)]).$$

Advantageously, in various embodiments, the present disclosure also relates to making an athermal integrated wavelength meter through the monotonic wavelength dependent transmission of an on-chip optical component. By measuring this transmission through a ratio of the optical light before and after the wavelength-dependent component, an unambiguous wavelength reading is provided.

Consider a section of length L with an optical attenuation coefficient $\alpha(\lambda)$ with explicit dependence on the wavelength $\lambda$. $\alpha(\lambda_2) > \alpha(\lambda_1)$ for any $\lambda_2 > \lambda_1$, i.e., $\alpha$ is a monotonic function of $\lambda$. For a given operating wavelength range $\Delta\lambda=(\lambda_2-\lambda_1)$, a certain loss differential might be required for a sufficient accuracy over the complete range. We can express this mathematically as $\exp(-\alpha(\lambda_1) L)/\exp(-\alpha(\lambda_2) L) = \xi$. From this expression, the required L is found to be $-\ln(\xi)/(\alpha(\lambda_1)-\alpha(\lambda_2))$. The total relative insertion loss for such length L becomes $\exp(-\alpha(\lambda) [-\ln(\xi)/\Delta\alpha]$. For a viable design (small L, low insertion losses that maximize SNR, sufficiently large $\xi$), a large $\Delta\alpha=(\alpha(\lambda_1)-\alpha(\lambda_2))$ is therefore required.

A monotonic and athermal $\alpha(\lambda)$ is best realized with non-interferometric techniques. Interferometry has by definition a direct dependence on the phase of the light, which is most affected by the surrounding environment, for example the temperature, pressure, or humidity. To reduce the sensitivity of interferometers, several imperfect techniques have been proposed. They include:
1. the use of different materials or waveguide geometries with thermo-optic coefficients of opposite signs, sometimes deposited as a cladding;
2. the use of optical modes and waveguide geometries that push the optical mode in a cladding material (e.g., $SiO_2$) that has less sensitivity than the waveguide core itself.

These compensation techniques tend to work over a limited $\Delta\lambda$ range. They tend to reduce the sensitivity by a modest factor (2-5×) rather than eliminate it. They can also be expensive and difficult to implement from a material integration standpoint.

However, high refractive index contrast platform such as silicon-on-insulator allows a large wavelength dependence of the mode field size if the waveguide itself is made very narrow. This is not sensitive to environmental perturbations, or to a much lower extent (more than 100×) than comparable interferometric methods. This optical mode has an exponential evanescent tail that grows proportionally to the wavelength and interacts strongly with material outside the waveguide core. This exponential tail, extending into the cladding region, tends to induce an exponential (linear in logarithmic scale) wavelength dependence on the losses, regardless of the loss mechanism. These potential mechanisms, that can be combined with each other, include:
1. absorption through metal, doped Si (free-carrier absorption), or any material with a bandgap small enough to cause absorption in the wavelength range of interest (e.g., Ge for the C-band);
2. substrate light coupling, depending on the thickness of the buried oxide layer (BOX used in silicon photonic wafers);
3. coupling into radiative modes through waveguide roughness or waveguide bends. The latter can also relax mask alignment tolerances with a side section, by further deconfining the mode and thus increasing the overlap with this section, even if it is farther away.

Advantageously, set forth herein are several approaches, which may be used one at a time or in any combination to produce the wavelength dependency. Referring now to FIG. 1, FIG. 1 is a diagram of an example implementation of a loss-based wavelength meter 10. Laser light 12 is transmitted (in the up direction in FIG. 1) and a small tap 14 between, e.g., about 3-10%, is included to tap a portion of the laser light 12. A first photodiode 1, after another tap 16, is configured to detect power at the input 18 to the loss-based wavelength meter 10. The loss-based wavelength meter 10 can include polarization shaping 20 and 21, if necessary, at the input 18 or at the input 18 and output 21 of a loss section 22. The loss section 22 can include a metal sheet 24 on top of a waveguide with or without a via to its side. The waveguide in the loss section 22 can include a narrower waveguide 26 (relative to the waveguide outside of the loss section 22), to deconfine the mode from the waveguide core. The loss section 22 can also include an adjacent doped Si or Ge section on one or both sides 28. Also, bent waveguides 30 can be used to relax the mask alignment precision or induce coupling into radiative modes. Finally, a second photodiode 2 is located after the loss section 22 for an output power measurement. A graph 32 in FIG. 1 illustrates a graph based on a ratio of the measurements of the photodiodes 1, 2 currents versus wavelengths. Accordingly, the value of the wavelength of the laser light 12 can be determined based on the ratio of the currents of photodiodes 1, 2 as shown in the graph 32.

Figure 2:
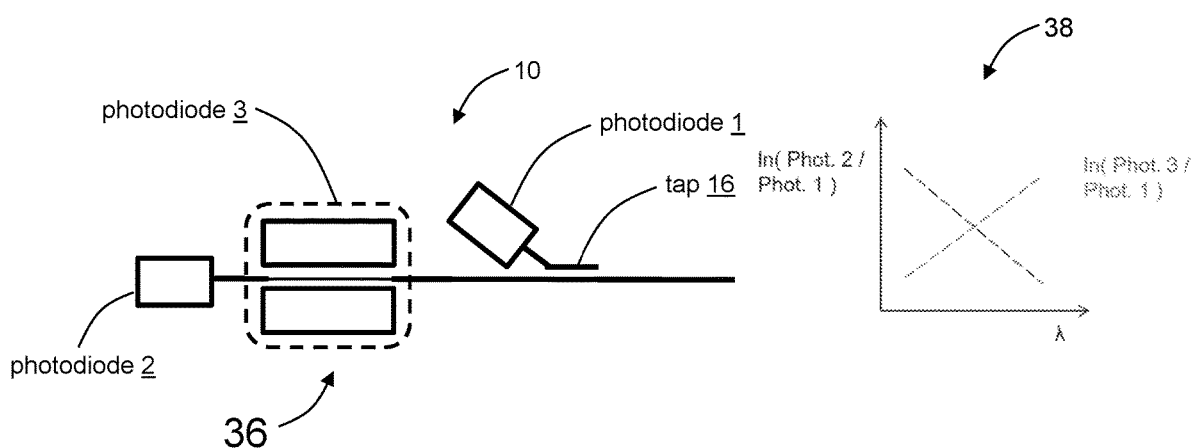
FIG. 2 is a diagram of another example implementation of the loss-based wavelength meter with a third photodiode formed by the side sections of Ge.

FIG. 2 is a diagram of another example implementation of the loss-based wavelength meter 10 with a third photodiode 3 formed by the side sections of Ge 36. The approach can be enhanced by a reading from this third photodiode 3.

In this approach, the third photodiode 3 is formed by the sum of the photocurrents from both side sections 36. Thus, a third photodiode 3 output current results from the sum of the photocurrents produced by both side sections 36. It allows a second ratio with the photocurrent of photodiode 1 as an independent estimate of the wavelength. This second ratio from the photocurrent of third photodiode 3 and the photocurrent of first photodiode 1 has a better Signal-to-Noise Ratio (SNR) at higher wavelengths (because long wavelengths extend farther away from the waveguide core, and so produce more photocurrent in the side sections), and a worse SNR at lower wavelengths, while the opposite is true for the first (original) ratio between the second photodiode 2 and the first photodiode 1 output photocurrents. This second approach ensures that no photon is wasted in the determination of the wavelength. If the third photodiode 3 is present, then the first one can be omitted, as the ratio can also be taken between the second photodiode 2 and third photodiode 3 to provide a unique reading. In fact, only two out of the three photodiodes need be selected, but keeping all three can provide SNR benefits.

Also, graph 38 in FIG. 2 illustrates a curve obtained using the ratio of the photodiodes 1, 2 versus wavelength, and a curve obtained using the ratio of the photodiodes 1, 3 versus wavelength. Accordingly, the value of the wavelength of the laser light 12 can be determined based on where the measurements producing the ratio of the photocurrents of the photodiodes 1, 2 are on the graph 38 and/or the measurements producing the ratio of the photocurrents of the photodiodes 1, 3 on the graph 38.

Optional polarization shaping sections: (e.g., transfer light from a Transverse Electric (TE) polarization into a Transverse Magnetic (TM) one, or vice-versa) can be included as one polarization is expected to have a much larger wavelength loss dependence to the chosen loss mechanism when compared to the other polarization.

Figure 3:
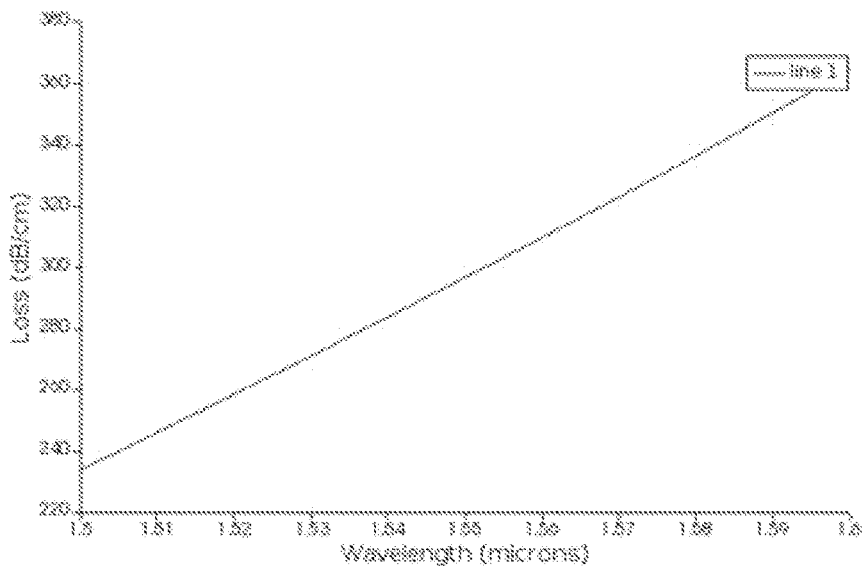
FIG. 3 is a graph of a possible implementation of the loss-based wavelength meter including a TM mode in a 220 nm thick Si strip waveguide overlapping with an Al layer above it.
Figure 4:
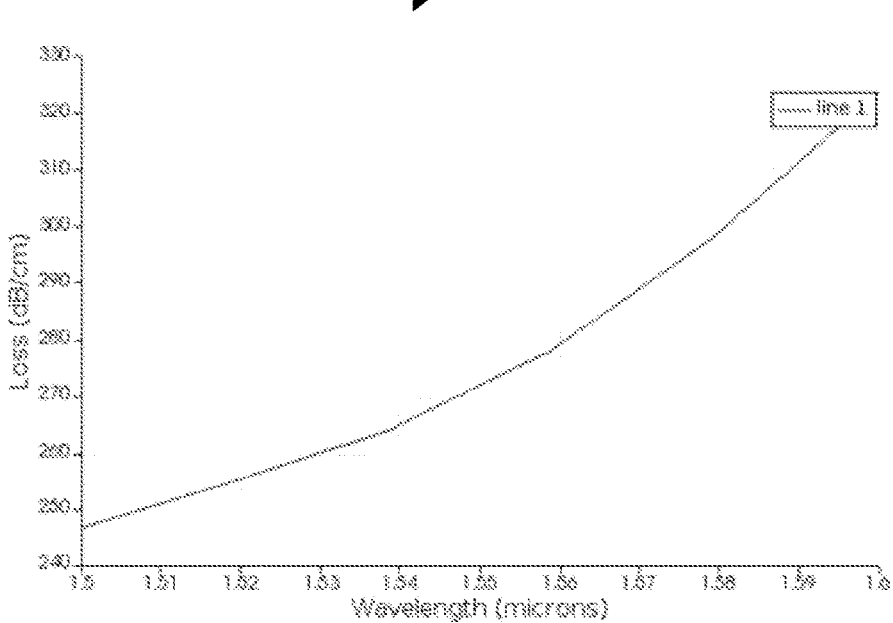
FIG. 4 is a graph of another possible implementation of the loss-based wavelength meter including a TE mode in a Si rib waveguide overlapping with a side Al via to its left.
Figure 5:
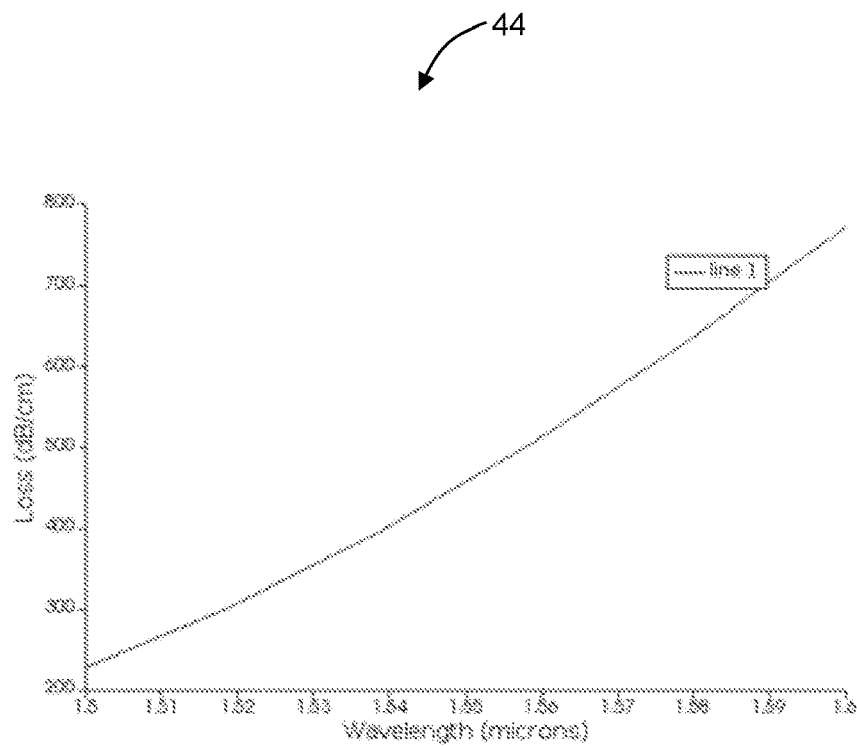
FIG. 5 is a graph of another possible implementation of the loss-based wavelength meter. including a TE mode in a 220 nm thick Si strip waveguide coupling strongly to a slab of doped Si with a uniform donor concentration placed to its left.
Figure 6:
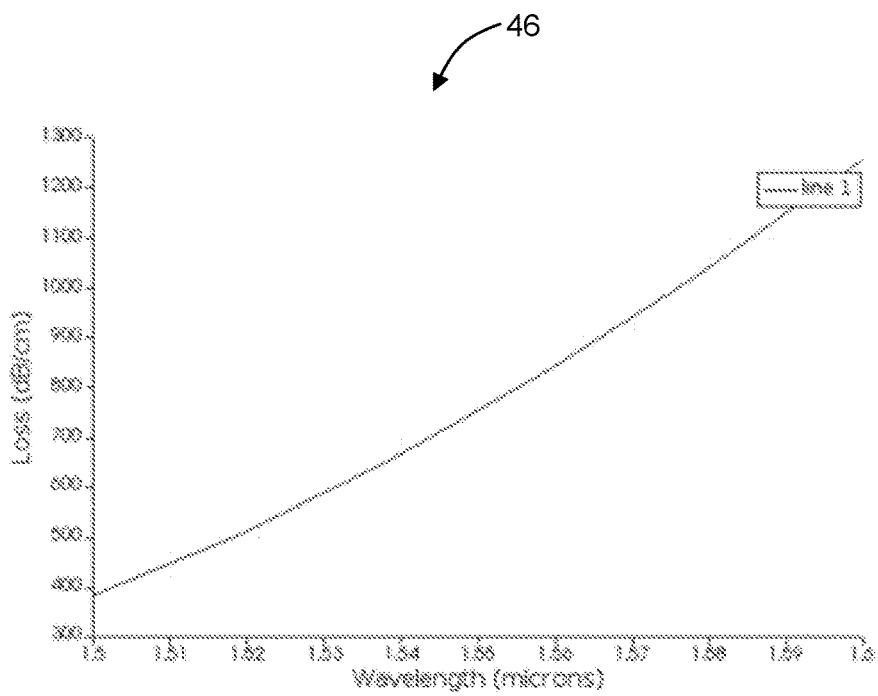
FIG. 6 is a graph of a further possible implementation of the loss-based wavelength meter including a TE mode in a 220 nm thick Si strip waveguide overlapping with a layer of Ge deposited to its left on a Si slab.

FIGS. 3-6 show graphs of optical loss against wavelength for four possible implementations of the loss-based wavelength meter 10. FIG. 3, illustrating a simulation example with top metal, includes a TM mode in a 220 nm thick Si strip waveguide overlapping with and strongly absorbed by an Al layer above it. This absorption is the dominant loss mechanism. FIG. 4, illustrating a simulation example with side metal, includes a TE mode in a Si rib waveguide overlapping with and absorbed strongly by a side A1 via to its left. This coupling or absorption is the dominant loss mechanism. FIG. 5, illustrating a simulation example with adjacent doped Si, includes a TE mode in a 220 nm thick Si strip waveguide coupling strongly to a slab of doped Si with a uniform donor concentration located to its left. This absorption is the dominant loss mechanism. FIG. 6, illustrating a simulation example with Ge, includes a TE mode in a 220 nm thick Si strip waveguide overlapping with and absorbed by a layer of Ge deposited on top and to its left on a Si slab. This absorption is the dominant loss mechanism.

Each of FIGS. 3-6 includes a graph (40, 42, 44, 46, respectively) illustrating loss (dB/cm) versus wavelengths. These graphs (40, 42, 44, 46) are determined based on the loss section 22 in the wavelength meter 10. Once the graph is determined, for example during an optical measurement during a calibration step, the wavelength of any laser light can be determined based on the photodiode current measurements. These graphs are obtained experimentally by characterizing the wavelength meter 10, and can then be used to determine the wavelength by reference to the graph.

All these examples (FIGS. 3-6), but particularly the last three (FIGS. 4-6), can be further enhanced with a bending radius applied to the waveguide. For the last three, another absorbing section can be added to the right side of the waveguide. Those of ordinary skill in the art will appreciate FIGS. 3-6 are not meant to represent examples of optimized designs nor exhaustive design possibilities, but only to serve as illustrative purposes.

This wavelength meter 10 can be used by itself or in conjunction with other wavelength meter approaches to obtain the desired measurement resolution.

Advantageously, set forth herein are several approaches, which may be used one at a time or in any combination to produce the wavelength dependency.

Figure 7:
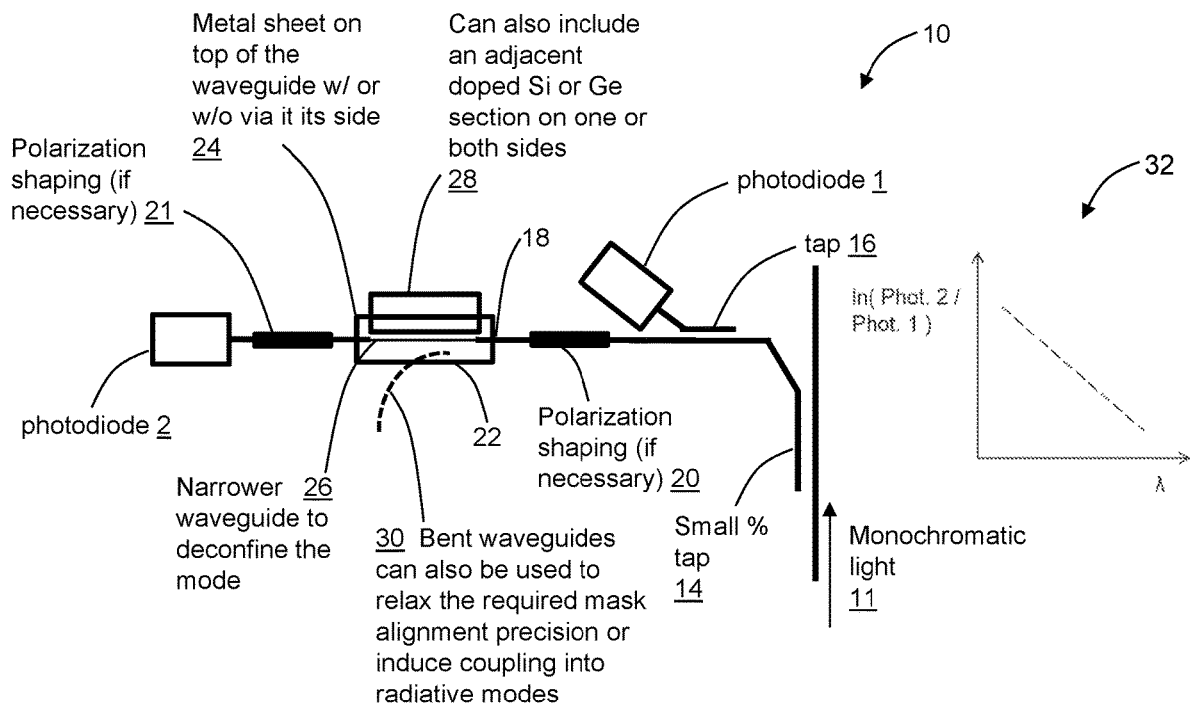
FIG. 7 is a diagram of a further example implementation of a loss-based wavelength meter depicting several approaches (used one at a time or in any combination to provide the wavelength dependence).

FIG. 7 is a diagram of an example implementation of a loss-based wavelength meter 10, which can be described similarly as the implementation in FIG. 1, however, in FIG. 7 monochromatic light 11 is depicted as being transmitted (in the up direction in FIG. 7). Light emitted from a laser is monochromatic, i.e., single-wavelength. Monochromatic light 11 is transmitted (in the up direction in FIG. 7) and a small tap 14 is included to tap a portion of the monochromatic light 11. A first photodiode 1, after another tap 16, is configured to detect power at the input 18 to the loss-based wavelength meter 10. The loss-based wavelength meter 10 can include polarization shaping 20 or 21, if necessary, at the input 18 or at the input 18 and output 21 of a loss section 22. The loss section 22 can include a metal sheet 24 on top of a waveguide with or without a via to its side. The waveguide in the loss section 22 can include a narrower waveguide 26 (relative to the waveguide outside of the loss section 22), to deconfine the mode. The loss section 22 can also include an adjacent doped Si or Ge section on one or both sides 28. Also, bent waveguides 30 can be used to relax the required mask alignment precision or induce coupling into radiative modes. Finally, a second photodiode 2 is located after the loss section 22 for an output power measurement. The loss mechanisms can include metal/doped Si absorption (dominant), mode overlap with waveguide roughness, and silicon substrate.

Advantageously, the wavelength meter 10 can maximize k-dependent losses.

A graph 32 in FIG. 7 illustrates a graph based on the measurements producing the ratios of the currents of photodiodes 1, 2 versus wavelengths. Accordingly, the value of the wavelength of the monochromatic light 11 can be determined based on where the measurements of the photodiodes 1, 2 are on the graph 32.

Figure 8:
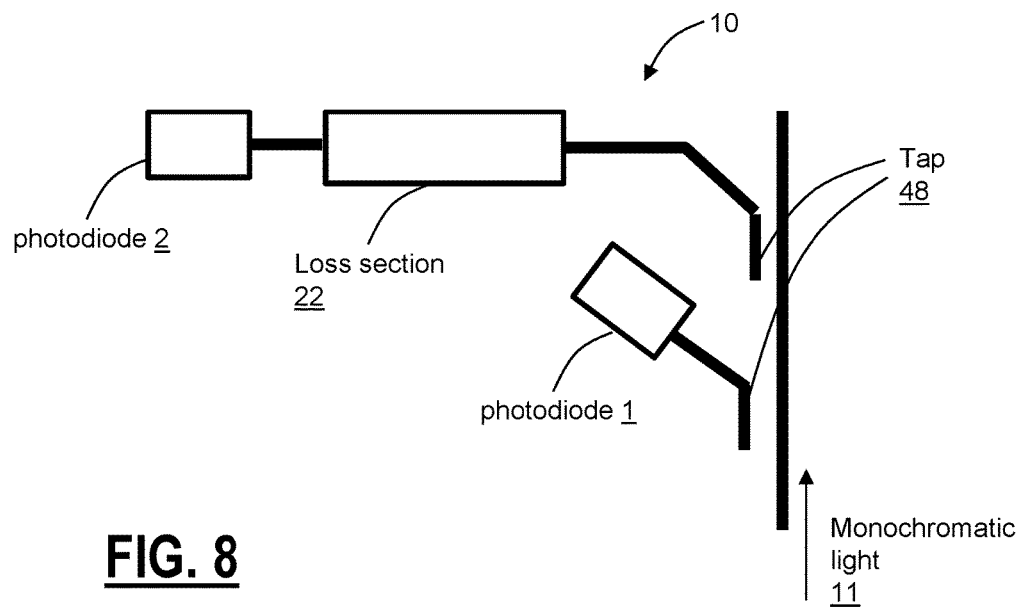
FIG. 8 is a diagram of an example implementation of a loss-based wavelength meter regarding compensating environmental drifts from the tap according to one arrangement (1).

With reference to FIG. 8, the thermal sensitivity of the photodiodes tends to self-compensate when a ratio between two identical ones is taken. Most often, the tap 48 before the absorbing section has itself a thermal sensitivity. If the wavelength meter 10 is part of another circuit, then this tap 48 can be placed in the circuit itself, and the same tap 48 used to couple light to the loss or lossy section 22. This is shown in FIG. 8.

Figure 9:
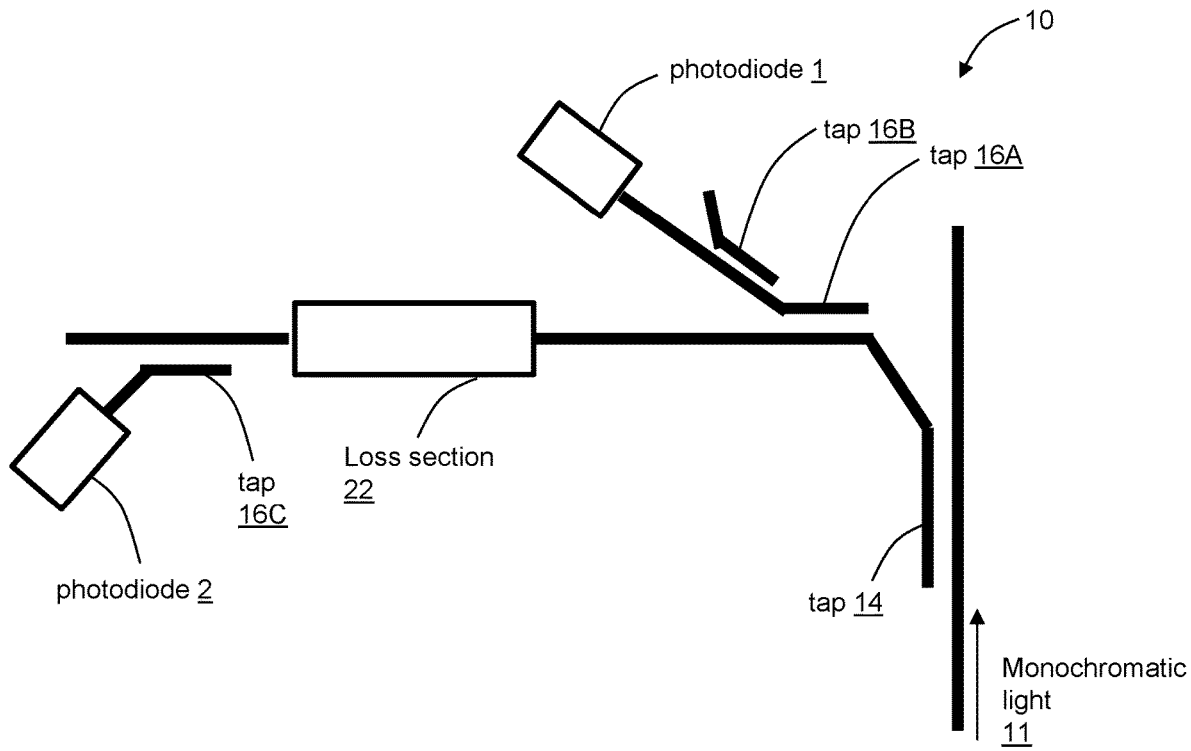
FIG. 9 is a diagram of an example implementation of a loss-based wavelength meter regarding compensating environmental drifts from the tap according to another arrangement (2).

More tap couplers (16A, 16B, 16C) can be used and configured to get better temperature insensitivity to the tap ratio of the couplers, as illustrated in FIG. 9. Before the lossy section 22, tap 16A sends light towards the lossy section 22 and photodiode 2 from its "through" port, and also sends light towards photodiode 1 from its "tap" port. Coupler 16C is inserted just before photodiode 2, providing light to photodiode 2 from its "tap" port. Coupler 16B is inserted just before photodiode 1, providing light to photodiode 1 from its "through" port. In this arrangement, photodiode 1 receives light that has travelled through the "tap" port of coupler 16A and through the "through" port of coupler 16B, while photodiode 2 receives light that has travelled through the "through" port of coupler 16A and through the "tap" port of coupler 16C. This configuration thus enables the light reaching the photodiodes to have travelled equivalent paths, excepted for the desired lossy section 22 (i.e. the ratio of the transmission towards photodiode 1 and 2 will be independent of the tapped fraction of the coupler, providing that similar devices are used at all locations, and so will be independent of its temperature dependency, if any). In the previously illustrated examples, taking the ratio of photocurrents of photodiodes located after a tap coupler should thus help in reducing the temperature sensitivity to the tap coupling ratio. Implementations using additional tap couplers are not limited to the one illustrated, provided to illustrate the concept. A temperature sensor can help with any residual sensitivity if it remains above a target specification. This wavelength meter implementation is easy to calibrate in temperature due to its non-periodicity.

Figure 10:
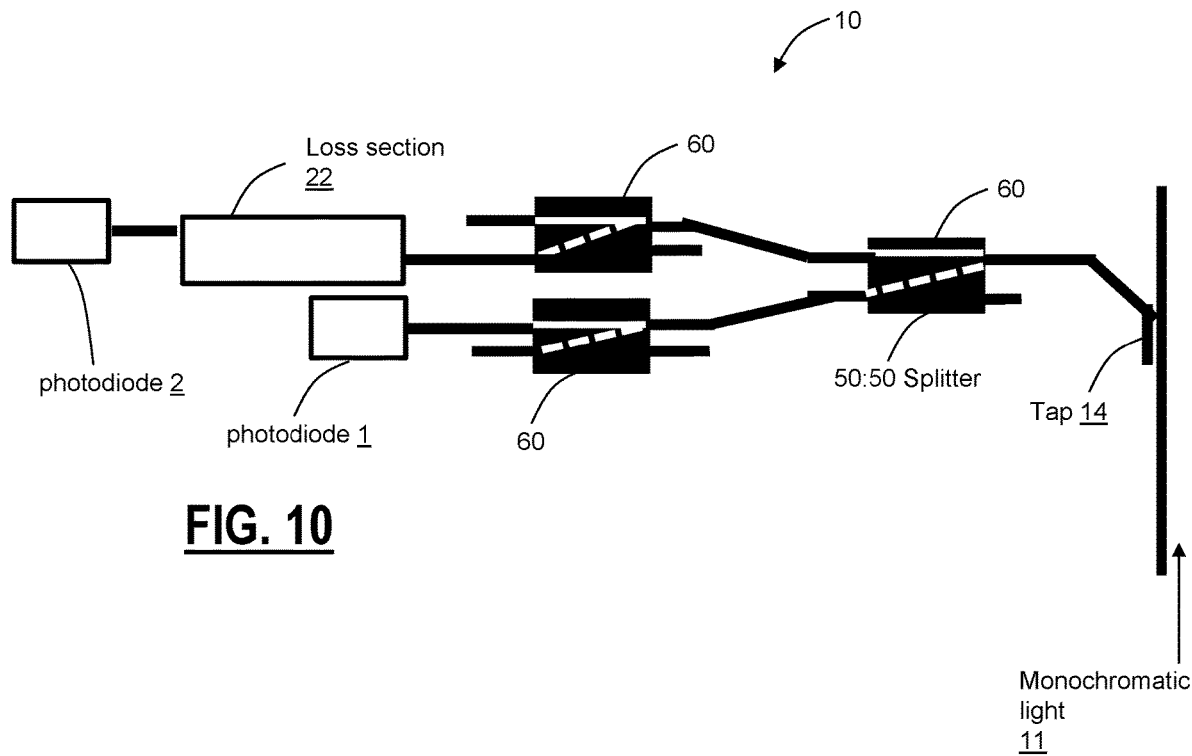
FIG. 10 is a diagram of an example of implementation of a loss-based wavelength meter regarding compensating environmental drifts from the tap according to a further arrangement (3).
Figure 12:
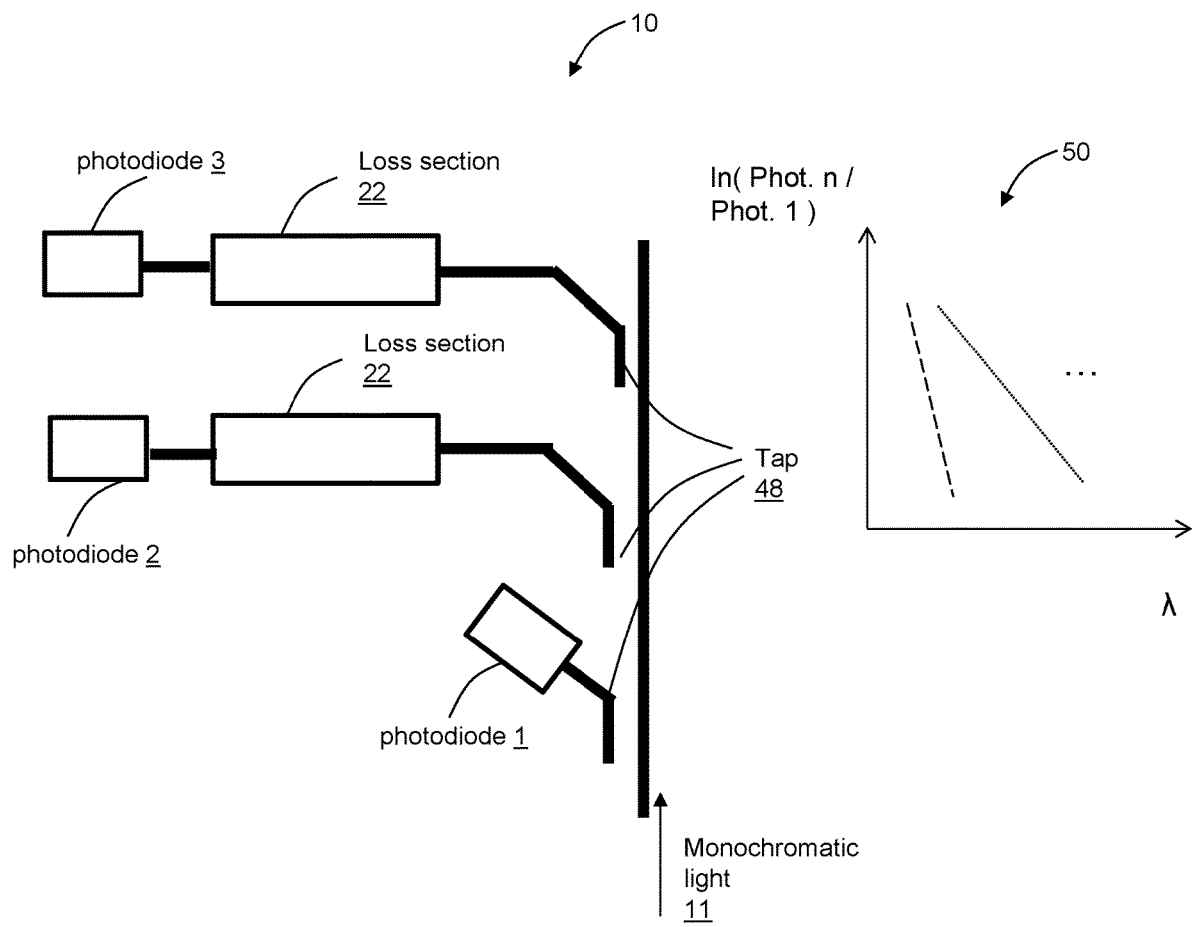
FIG. 12 is a diagram of an example implementation of a loss-based wavelength meter covering different sub-bands in parallel.

An implementation, as shown in FIG. 10, with 50:50 splitters 60 can also improve the compensation of the tap 16 of FIG. 1 and FIG. 7. FIG. 12 is a diagram of an example of implementation of a loss-based wavelength meter 10 regarding compensating environmental drifts from the tap, according to an arrangement (3). The reference photodiode 1 encompasses the same path loss as the photodiode 2 except for the lossy section 22 of interest. A splitting realized with 50:50 splitters 60 as shown in FIG. 12 maximizes total transmitted power as compared with any other splitting ratio between 0 and 100%.

Figure 11:
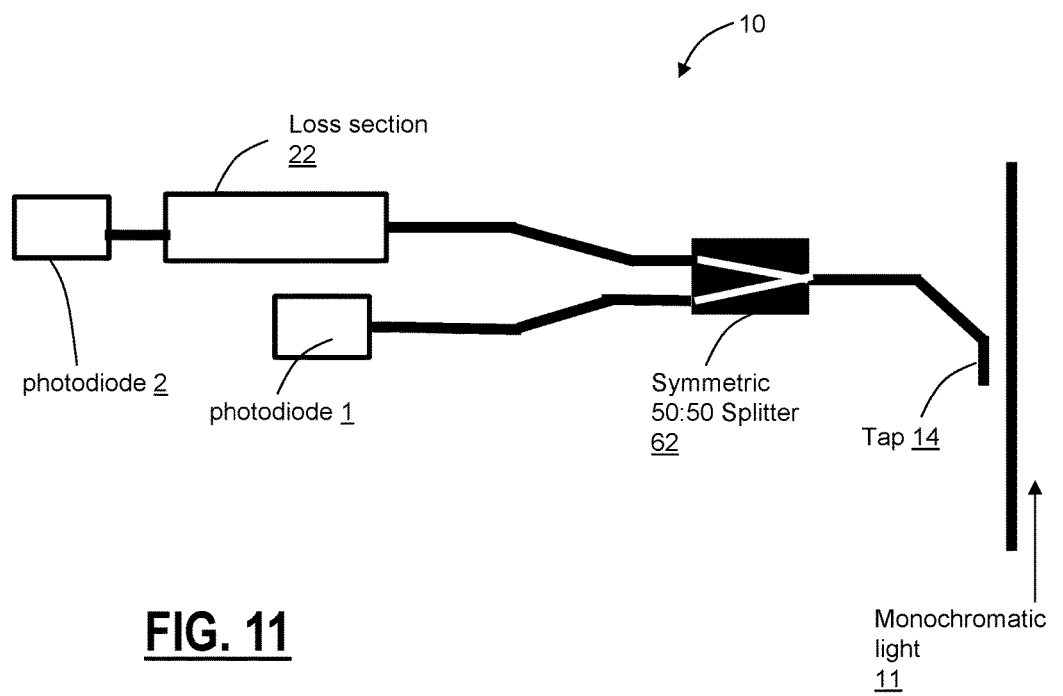
FIG. 11 is a diagram of an example of implementation of a loss-based wavelength meter regarding compensating environmental drifts from the tap according to another arrangement (4).
Figures 13, 14:
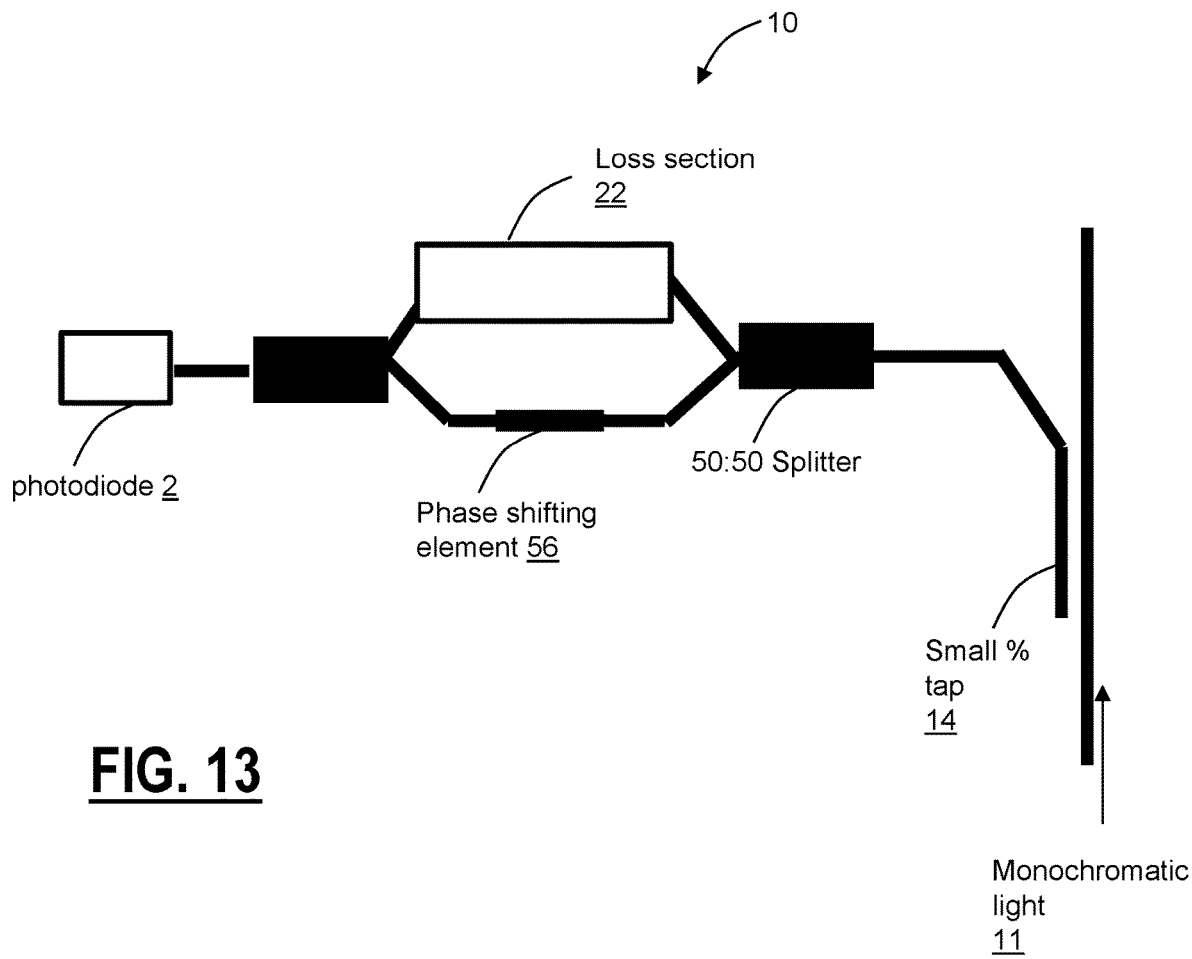
FIG. 13 is a diagram of an example implementation of a loss-based wavelength meter by using different losses in a Mach-Zehnder interferometer (MZI).
FIG. 14 is a flowchart detailing a method of utilizing a loss-based wavelength meter.

FIG. 11 is a diagram of an example of implementation of a loss-based wavelength meter 10 regarding compensating environmental drifts from the tap according to another arrangement (4). As shown in FIG. 13, choosing a symmetric 1×2 50:50 splitter 62 can also simplify the foregoing implementation and achieve the same objective of compensating non-idealities of the tap.

For a large Δλ requiring small Δα, the most limitative aspect regarding wavelength accuracy results from multipath interference (MPI) induced by reflections between various points of the optical circuit, and accumulating across the full structure. If sufficiently high, this MPI superimposes oscillations on the transmission and renders the wavelength meter partly non-monotonic over small parts of the wavelength range. If the slope of the lossy section is sufficiently high, then this MPI will not reach the threshold to non-monotonicity, but will still affect the precision of the final wavelength reading over small changes in wavelength in the presence of other noise. To maintain a sufficiently high slope, the total Δλ to be addressed can be divided into sub-bands and covered by different sections in parallel as shown, e.g., in FIG. 12. FIG. 12 is a diagram of an example implementation of a loss-based wavelength meter 10 covering different sub-bands in parallel. The graph 50 in FIG. 12 illustrates a graph based on the measurements of the photodiodes 1, 2 versus wavelength.

The splitting into parallel segments can be done more directly with a 1×N coupler. Generally, compensation of the MPI, if it occurs before the wavelength meter, works better if the two signals forming the ratio are comparable in amplitude. Having multiple slopes covering the whole band can ensure that this happens.

In the previous illustrated example, very steep slopes have been used, each covering a sub-band of the initial targeted wavelength range. Another strategy can be where each of the N branches have a slope covering the entire wavelength range but be different for each of the N branches. In this manner, with an unknown incoming wavelength, one will obtain N ratios ($i_{PD2}/i_{PD1}$). These ratios can then be used to find the wavelength that best matches the N ratios expected according to a pre-calibrated look-up table (i.e., a table of ratios vs wavelength for each individual branch). The determined wavelength could be also obtained as the mean of the wavelength determined from the ratio of each branch. Using such a fit (or average value) could reduce the error associated to multi-path interference by smoothing over the MPI occurring in each branch independently. To ensure that the MPI generated in each branch is independent and different, one could adjust the path length between the components to be different in each of these N branches.

More generally, wavelength meter 10 can also be combined with a highly accurate but periodic optical reference such as a standard etalon. The unambiguous reading over the full range selects the corresponding periodic order from the optical reference. Without such a monotonic reading, the order can be found from different techniques such as combing optical references that are offset with respect to each other or have different periodicities.

Referring now to FIG. 13, another approach is to use the differential losses in a Mach-Zehnder interferometer (MZI). FIG. 13 is a diagram of an example implementation of a loss-based wavelength meter 10 minimizing MPI contribution by using different losses in a Mach-Zehnder interferometer (MZI). One arm 52 contains the lossy section 22 while the other arm 54 is a regular waveguide containing a phase shifting element 56. For a fixed wavelength, if the phase in at least one arm (52, 54) is swept in a range sufficiently large to reach both a minimum and a maximum of the transition curve, the extinction ratio of this MZI, defined as a max transmission over a min transmission, depends directly on the difference in propagation losses between the two arms 52, 54, which in turn depends directly on the wavelength. A Michelson interferometer or any suitable interferometer with at least two or more interferometric paths could also be used.

FIG. 14 is a flow chart detailing a method of utilizing a loss-based wavelength meter 10, according to embodiments. As disclosed therein, a method of utilizing a loss-based wavelength meter includes providing monochromatic light through a loss section having a monotonic wavelength dependency (step S1); detecting power of the monochromatic light after the loss section (step S2); and determining a wavelength of monochromatic light based on measurements after the monochromatic light has gone through the loss section (step S3). The determining can be based on a ratio of the measurements from a plurality of photodetectors. Also, the determining can be based on the measurements after the monochromatic light traverse two different arms of an interferometer. The method can further include utilizing a plurality of taps for temperature insensitivity based on tap ratios of the plurality of taps. The method can further include combining the measurements with a measurement from a highly accurate but periodic optical reference.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, one or more processors, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements described herein can be used in any and all combinations with each other.

What is claimed is:

1. A loss-based wavelength meter comprising:
a first photodiode and a second photodiode each configured to measure power of monochromatic light; and
a loss section having a monotonic wavelength dependency, configured to perform evanescent coupling of the monochromatic light for athermality based on the loss section being a waveguide configured with an evanescent coupling mechanism, wherein the loss section is located between the first photodiode and the second photodiode, and wherein a wavelength of the monochromatic light is determined based on a ratio of measurements of the first photodiode and the second photodiode.

2. The loss-based wavelength meter of claim 1, further comprising a polarizing shaping section.

3. The loss-based wavelength meter of claim 1, wherein the second photodiode is located before the loss section for an input power measurement.

4. The loss-based wavelength meter of claim 1, wherein the loss section includes absorbing metal for a wavelength range of interest for the evanescent coupling mechanism.

5. The loss-based wavelength meter of claim 1, wherein the loss section includes a doped semiconductor for the evanescent coupling mechanism.

6. The loss-based wavelength meter of claim 1, wherein the loss section includes a semiconductor with a bandgap lower than photon energy in a wavelength range of interest for the evanescent coupling mechanism.

7. The loss-based wavelength meter of claim 1, wherein the loss section includes Ge for the evanescent coupling mechanism.

8. The loss-based wavelength meter of claim 1, wherein the loss section includes bend waveguides to assist modal overlap with an adjacent section for the evanescent coupling mechanism.

9. The loss-based wavelength meter of claim 1, wherein the loss section utilizes coupling into radiative modes through waveguide roughness or waveguide bends.

10. The loss-based wavelength meter of claim 1, wherein the loss section utilizes light coupling to a substrate.

11. The loss-based wavelength meter of claim 1, further comprising a plurality of taps for temperature insensitivity based on tap ratios of the plurality of taps.

12. The loss-based wavelength meter of claim 1, wherein the athermality is over a certain wavelength range.

13. The loss-based wavelength meter of claim 1, wherein the monochromatic light has an exponential evanescent tail that grows proportionally to the wavelength that extends into a cladding region in the loss section, wherein loss, on the exponential evanescent tail, is exponentially dependent on the wavelength.

14. The loss-based wavelength meter of claim 1, wherein the loss section has a defined slope for covering a certain wavelength range of interest.

15. The loss-based wavelength meter of claim 14, wherein the loss section is one of a plurality of loss sections, each of the plurality of loss sections have a defined slope for covering a certain wavelength range of interest.

16. A method of utilizing a loss-based wavelength meter comprising:
providing monochromatic light through a loss section having a monotonic wavelength dependency;
performing, by the loss section, evanescent coupling of the monochromatic light for athermality based on the loss section being a waveguide configured with an evanescent coupling mechanism,
detecting power of the monochromatic light before and after the loss section; and
determining a wavelength of monochromatic light based on a ratio of measurements of the power before and after the monochromatic light has gone through the loss section.

17. The method of claim 16, wherein the determining is based on the measurements after the monochromatic light traverse two different arms of an interferometer.

18. The method of claim 16, further comprising
utilizing a plurality of taps for temperature insensitivity based on tap ratios of the plurality of taps.

19. The method of claim 16, further comprising
combining the measurements with a measurement from a highly accurate but periodic optical reference.

20. The method of claim 16, wherein the athermality is over a certain wavelength range.

* * * * *